(12) United States Patent
Everhart et al.

(10) Patent No.: US 7,843,692 B2
(45) Date of Patent: Nov. 30, 2010

(54) MOBILE MODULAR COMMUNICATION SYSTEM

(75) Inventors: Brian K. Everhart, Shepherdstown, WV (US); Jessica A. Denson, Sterling, VA (US); Melvin W. Clarke, Vienna, VA (US)

(73) Assignee: Dtech Labs, Inc., Sterling, VA (US)

( * ) Notice: Subject to any disclaimer, the term of this patent is extended or adjusted under 35 U.S.C. 154(b) by 50 days.

(21) Appl. No.: 12/346,360

(22) Filed: Dec. 30, 2008

(65) Prior Publication Data
US 2010/0165571 A1 Jul. 1, 2010

(51) Int. Cl.
*H05K 7/20* (2006.01)

(52) U.S. Cl. ............. 361/695; 361/679.49; 361/679.55; 454/184; 455/90.3

(58) Field of Classification Search ............ 361/679.46, 361/679.48, 679.49, 688–697, 717–727, 361/732, 752, 796, 797, 788; 454/184; 174/50, 174/520, 50.02; 165/80.3, 104.33, 185; 455/7, 455/9, 347, 348, 15, 17, 561, 562.1, 90.3 455/552.1; 379/57–63
See application file for complete search history.

(56) References Cited

U.S. PATENT DOCUMENTS

| | | | |
|---|---|---|---|
| 5,226,540 A | | 7/1993 | Bradbury |
| 5,309,315 A | | 5/1994 | Naedel et al. |
| 5,533,097 A | * | 7/1996 | Crane et al. .............. 455/552.1 |
| 5,570,270 A | | 10/1996 | Naedel et al. |
| 5,621,890 A | * | 4/1997 | Notarianni et al. .......... 710/303 |
| 6,052,278 A | | 4/2000 | Tanzer et al. |
| 6,208,507 B1 | * | 3/2001 | Harvey .................. 361/679.55 |
| 6,317,329 B1 | | 11/2001 | Dowdy et al. |
| 6,405,058 B2 | * | 6/2002 | Bobier ..................... 455/562.1 |
| 6,654,241 B2 | | 11/2003 | Hillyard et al. |
| 6,839,571 B2 | * | 1/2005 | Bobier ........................ 455/561 |
| 6,907,230 B2 | * | 6/2005 | Sit et al. ..................... 455/90.3 |
| 7,224,947 B2 | * | 5/2007 | Sit et al. ..................... 455/90.3 |
| 7,363,392 B2 | | 4/2008 | Thomas |
| 7,372,705 B1 | * | 5/2008 | Spivey et al. ................ 361/796 |
| 7,558,193 B2 | * | 7/2009 | Bradbury et al. ............. 370/217 |
| 2008/0037218 A1 | | 2/2008 | Sharma et al. |

FOREIGN PATENT DOCUMENTS

GB          2 278 941 A     12/1994

* cited by examiner

*Primary Examiner*—Michael V Datskovskiy
(74) *Attorney, Agent, or Firm*—Birch, Stewart, Kolasch & Birch, LLP

(57) ABSTRACT

A mobile, modular communications device, featuring a multiple-slot base chassis designed to support a plurality of individual user-configurable and interchangeable personality modules, capable of providing the ability to accept secure/classified user communications, including voice, data and video, the means to encrypt or secure such user communications through either internal or external encryption capabilities, the means to optimize the secure voice, data and video communications for transmission across a remote reachback communications link and the ability to provide multiple network/uplink reachback transmission alternatives, such as local area networks, satellites, cellular, ISDN or other forms of fixed or wireless communications. The invention is intended to provide a standardized, structured and modular approach to the provisioning of different technologies within the overall system and to be capable of being deployed as a man-carry or rack-embedded unit.

17 Claims, 14 Drawing Sheets

MOBILE MODULAR COMMUNICATION SYSTEM

FIELD OF THE INVENTION

The present invention relates generally to communications and networking devices and more particularly to mobile, modular devices providing either unsecure, secure or a combination of unsecure and secure communications from remote or mobile locations to other mobile or remote locations or to central site locations.

BACKGROUND OF THE INVENTION

Electronic communications devices have played an increasingly significant role in business, personal and government operations since their original inception. As the requirement for increased integration of types of communications systems, such as voice, data and video, have occurred, so too has the requirement for integrated systems that allow for these devices to operate in an integrated mobile fashion, over a plurality of reachback/network systems. Traditionally, this requirement has been met by either the placement of commercially available equipment into mobile communications racks (with multiple, independent components wired together via external cables and powered individually), which can be extremely large and difficult to transport, or integrated into custom single-purpose products, which can be small and light but limited in their application. Some of these systems have offered a modest level of modularity, through the ability to add features through custom or product-specific slots.

There presently exists a need for small, highly mobile and highly modular systems allowing for communications users to take advantage of the best available reachback/network system at any given time, regardless of their location or ability to attain access to fixed communications or power sources. There also exists an increasing demand, for both commercial and government use, for the integration of various types of encryption systems into these mobile communications devices, including both stand-alone Inline Network Encryptor (INE) devices, such as the KG-175, KG-250 and KIV-54EM01, as well as secure voice/data devices like the STU-III (Secure Telephone Unit, Third Generation), STE (Secure Terminal Equipment) and SCIP (Secure Communications Interoperability Protocol) units.

There is a need for mobile, modular communications system offering standardized modules, an open-slot architecture and the ability to allow a user to configure the system on demand to meet a particular communications requirement through the use of different control, user access, computer processing, encryption support and network access modules.

SUMMARY OF THE INVENTION

A mobile, modular communications system provides communications between combinations of remote and central locations and comprised of a base chassis, multiple power and communications backplane interconnect systems and a plurality of interchangeable personality modules, capable of being transported in, and used within or external to, a man-carry transport case or capable of being mounted in a fixed-rack system for deployment in vehicular or airframe systems. The system allows for the chassis to vary in both size, number of slots and the types of backplanes and technologies supported.

DETAILED DESCRIPTION OF THE INVENTION

The present invention involves the modularization of secure mobile communications systems and, in particular, communications systems that involve the simultaneous support of both secure and non-secure user communications. The present invention is exemplified in a number of different embodiments, implementations and applications, a variety of which are summarized in this section.

Figure 1:
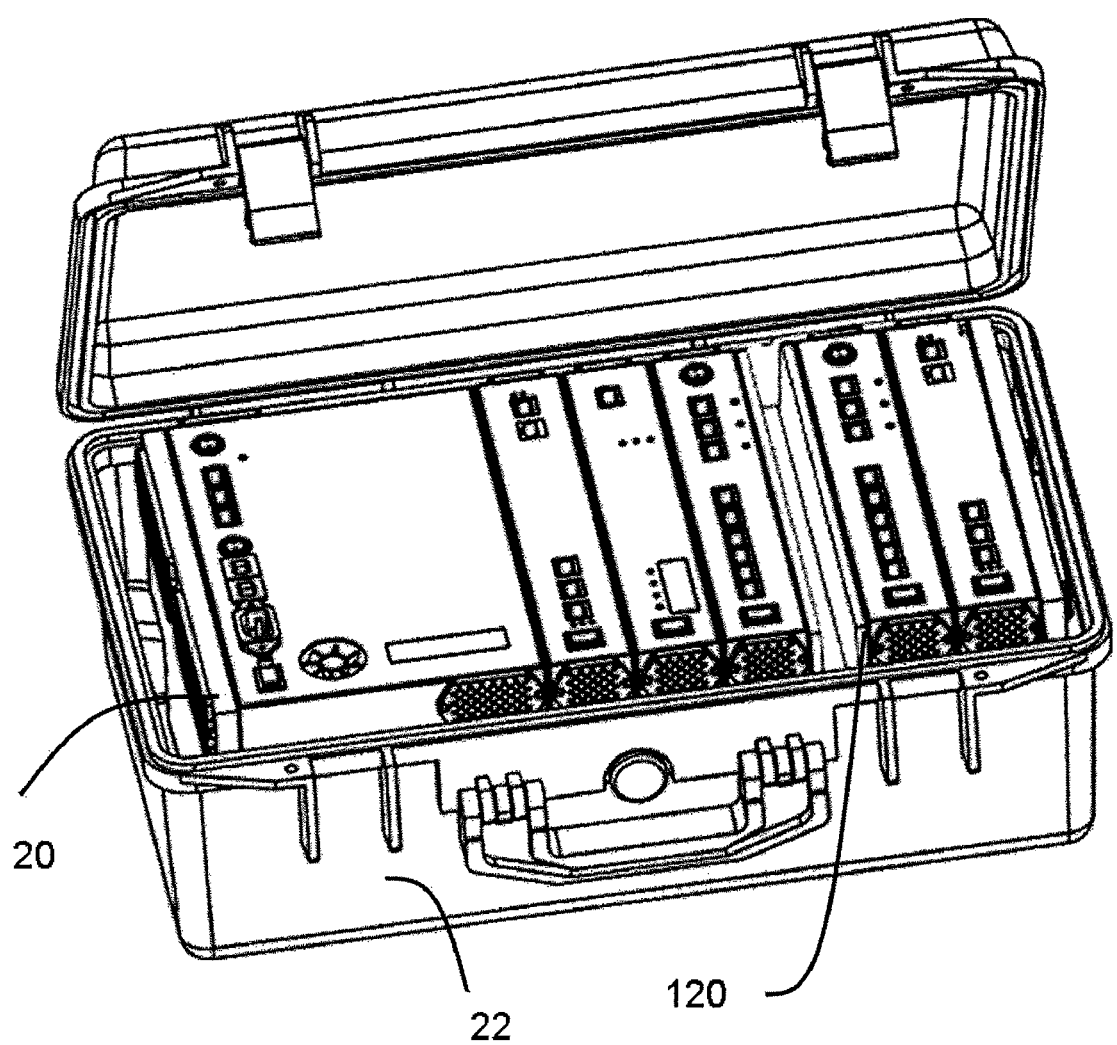
FIG. 1 depicts a complete system in a rugged transport case.

The system depicted in FIG. 1 has structured modularity and adaptability allowing for a user to reconfigure the system using standardized modules to meet specific communications requirements on a case-by-case basis. The system includes two different sized multi-slot modular chassis units, a primary unit 20 and a secondary unit 120 carried in a rugged transit case 22 suitable for man-carry and airline carry-on deployment. The case may be fabricated from any suitable material, such as metal or high impact plastic. The case may have a water tight seal to protect the internal components from harsh conditions. As shown, a multi-slot modular chassis may support a varying number of personality module slots, ranging from a minimum of 1, to a typical maximum of 9, although a chassis having a larger number of slots can easily be fabricated.

Figure 2:
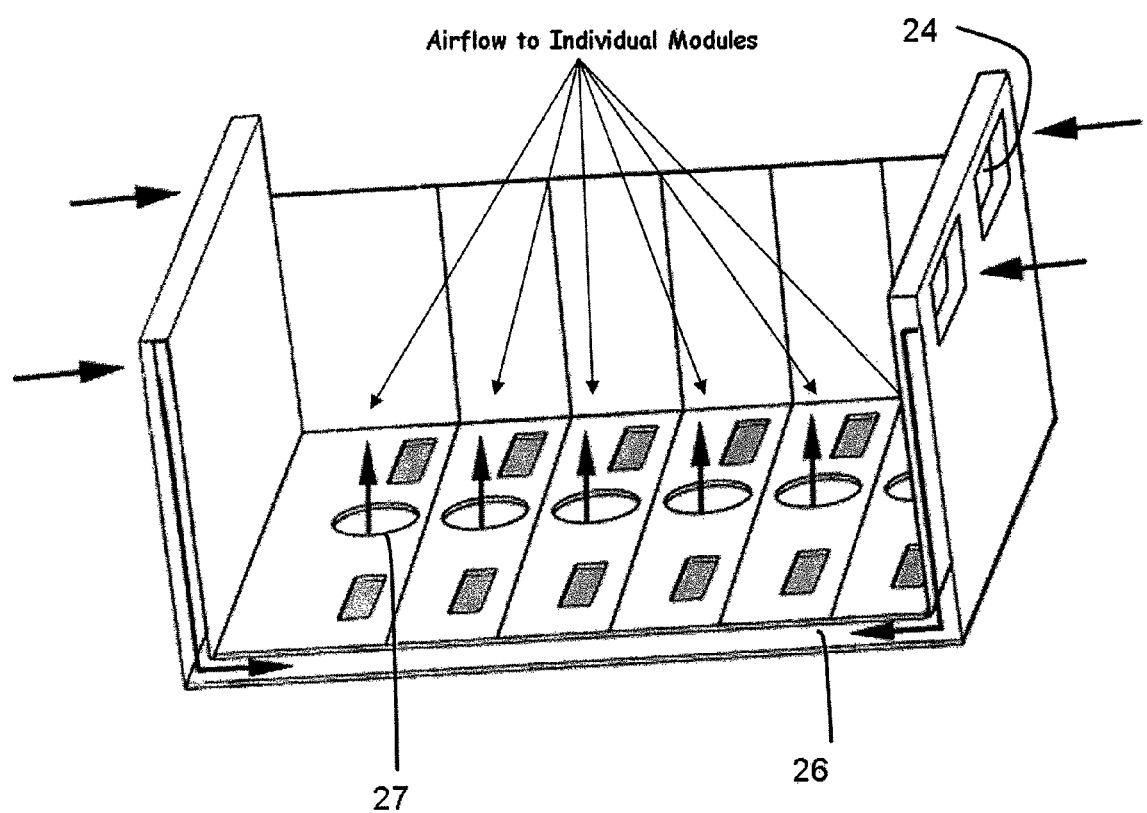
FIG. 2 is a cut-away view showing a base chassis and the internal airflow plenum.

Each of the multi-slot modular chassis includes an air intake 24 in one or more side walls that communicates with an internal airflow plenum 26 extending across the bottom and both side walls, as shown in FIG. 2, for cooling individual personality modules, an internal communications backplane and an internal power backplane, each of which will be described in more detail later. Each slot is provided with an aperture 27 for allowing air flow upward from the chassis into the module occupying that slot.

The multi-slot modular chassis is designed to support multiple backplanes, providing both IP-based communications and DC power distribution to individual personality module slots and terminating in standardized connectors such as to allow for any personality module to be physically installed in any personality module slot. Both communications and power backplanes may exist in either flexible cable or fixed PCB (printed circuit board) format and may be EMI (electromagnetic interference) shielded.

Figure 3:
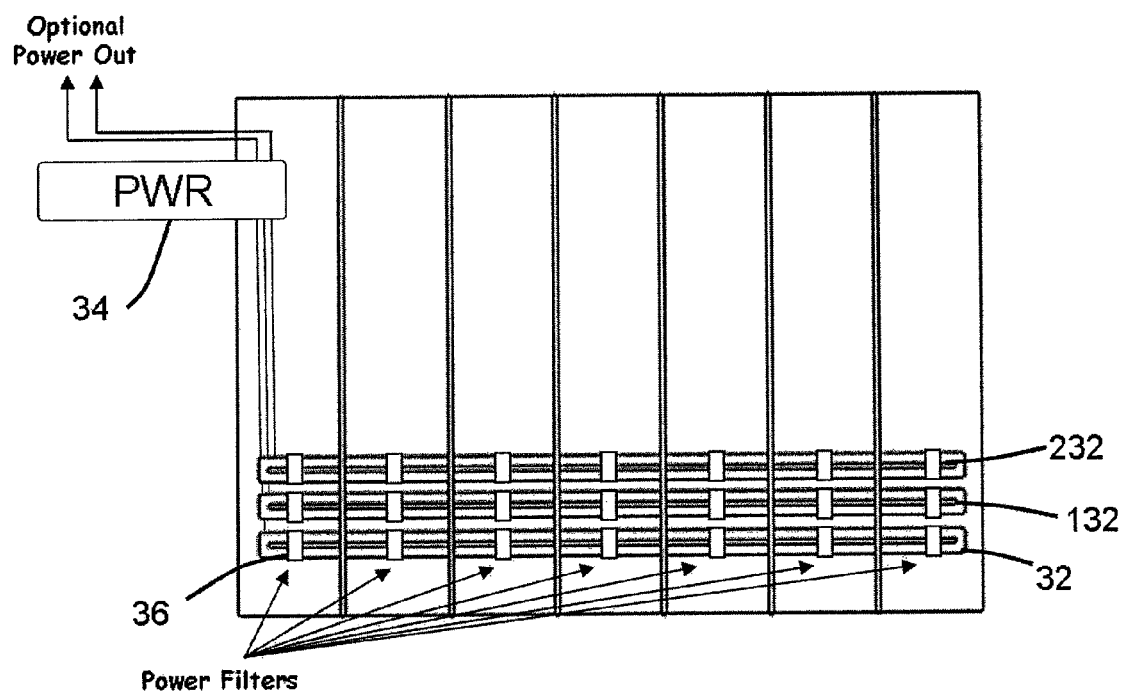
FIG. 3 depicts a power distribution backplane and various power input/output features.

As shown in FIG. 3, each multi-slot modular chassis will typically have a primary DC power backplane 32, while different embodiments allow multiple physically independent DC power backplanes 132, 232 to co-exist in a single chassis or, alternatively, multiple DC power backplanes may co-exist on a single PCB or flexible cable. The power may be supplied by an external AC or DC source or an internal battery system, most likely contained in the control module. FIG. 3 also demonstrates the function of a control personality module, in slot 1, in providing power to one or more DC power backplanes 34 so that power may be provided to external needs. Each DC power backplane, whether physically independent or part of a single physical PCB or flexible cable supporting multiple individual DC power backplanes, terminates at individual personality module slots through a filtered power connector 36 such as to provide a clean power source to each personality module.

Figure 4:
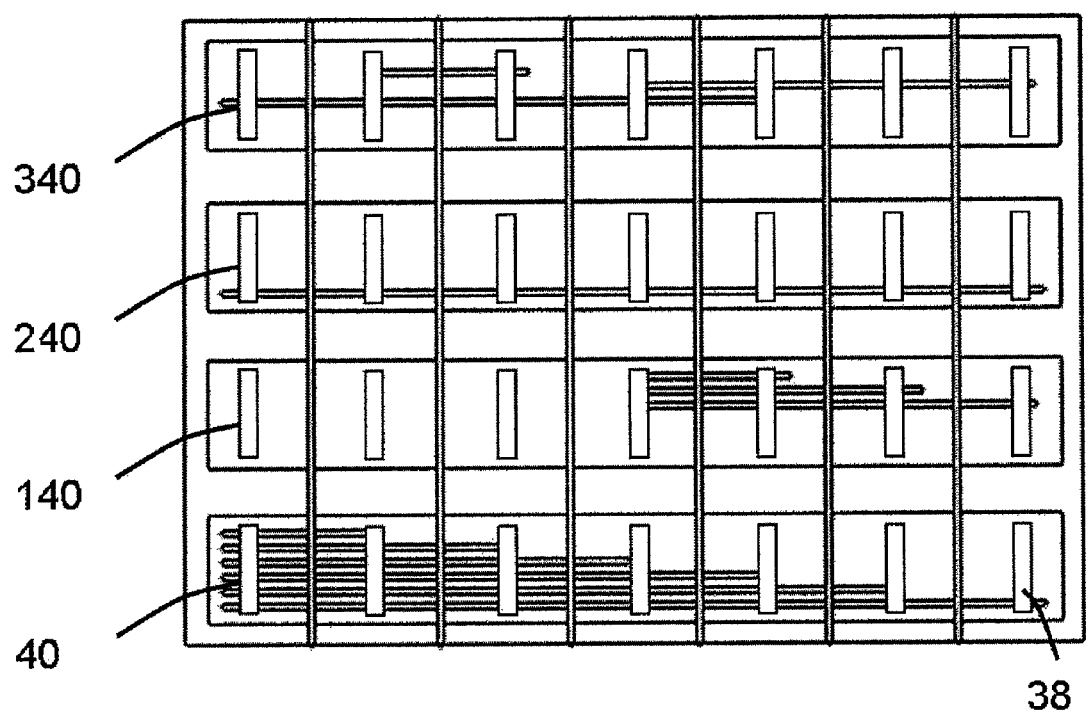
FIG. 4 depicts IP/LAN backplane architectures.

In different embodiments of the invention, as shown in FIG. 4, multiple physically independent IP-based communications backplanes may co-exist in a single multi-slot modular chassis, or, alternatively, multiple IP-based communications backplanes may co-exist on a single PCB or flexible cable. Each IP-based communications backplane, whether physically independent or part of a single physical PCB or flexible cable supporting multiple individual IP-based communications backplanes, terminates at individual personality module slots in a standardized connector 38 common to all personality modules.

Additionally, IP-based communications backplanes may be configured to allow selective communication between multiple personality module slots. In the first IP backplane 40, all personality module slots are connected to a single common personality module slot, which will retain a control module and is shown as slot 1. A second IP backplane 140 has a subset of personality module slots are connected to a single common personality module slot, which may be any slot in the chassis, and is shown here as the fourth slot. A third backplane 240 where all personality module slots are connected together through a shared IP-based communications backplane (acting as a shared 10/100/1000 Ethernet LAN hub), or fourth backplane 340 where a subset of individual personality module slots are connected directly and independently of other IP-based communications backplanes within the multi-slot modular chassis are some of the many possibilities. The flexibility to deploy a multi-slot modular chassis with any combination of the IP-based communications backplanes shown allows the user to maximize their options for configuration of personality modules to meet mission-specific communications requirements. In certain embodiments of the invention, an IP-based communications backplane does not need to be present if individual Personality Modules have the ability to connect externally between units, by means such as a cable tether. Additionally, IP-based communications connectors can be enhanced with the addition of DC power connector functionality to eliminate the requirement for an independent DC power connector.

Figure 5:
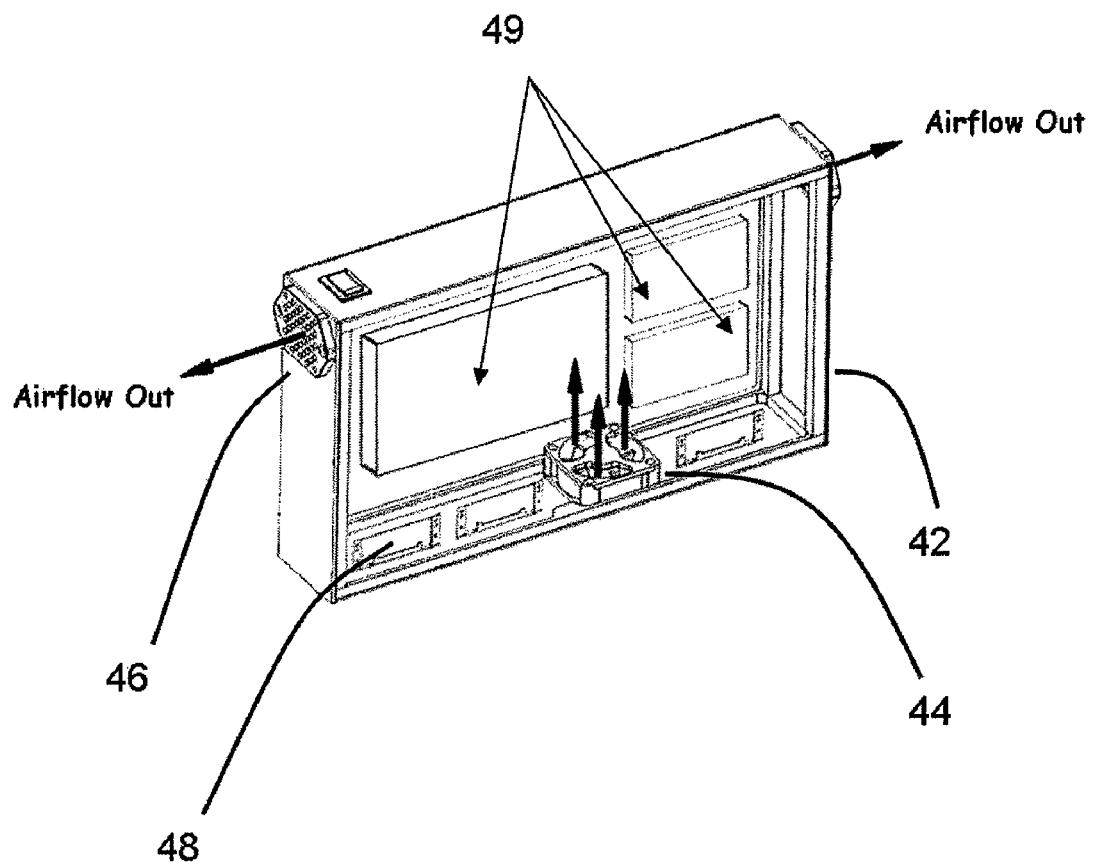
FIG. 5 is a cut-away view of an individual module showing the internal airflow, sample placement of internal components and backplane connectors.

Each personality module 42, as seen in FIG. 5 has an internal cooling mechanism mating with the cooling system of the chassis. Each module has an air intake 44, such as a fan, to draw air into the module from the chassis aperture 27 and exhaust ports 46 for expelling the air form the module. Appropriate IP-data communications and DC power interface backplane connectors 48 are provided on the bottom of the module for interfacing with connectors on the chassis backplane. The connectors allow data and power connections with the module specific core components 49. The standardized form-factor of the personality module allows it to occupy any slot within a multi-slot modular chassis. While the embodiment shown in FIG. 5 is a single slot personality module, other embodiments of the personality module may occupy multiple slots. All modules, whether control or general, can be EMI shielded to prevent interference. This is particularly useful when the module supports devices having classified information.

Figure 6:
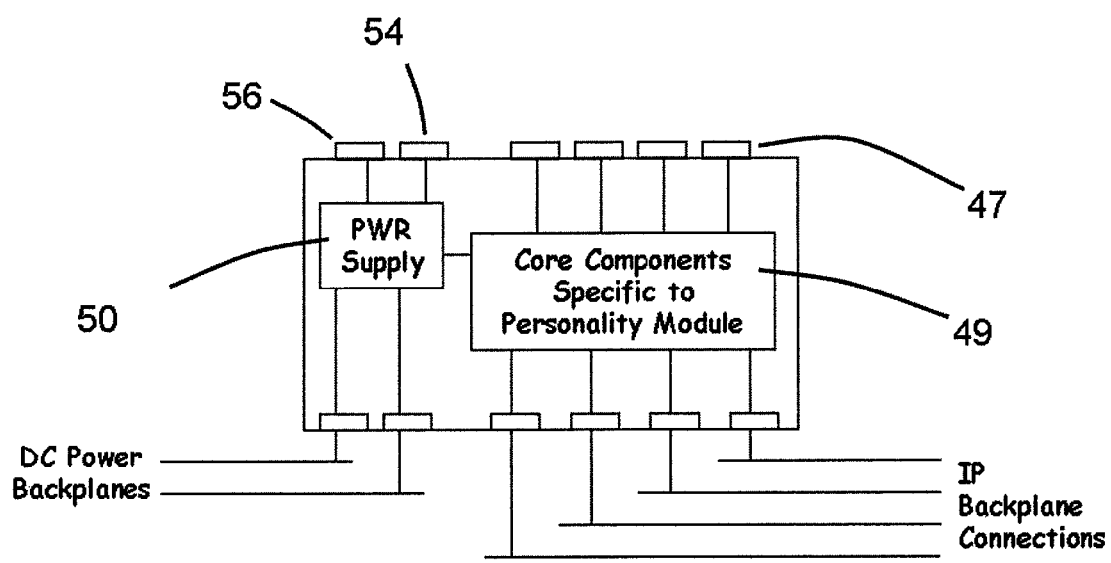
FIG. 6 is a schematic view of a general personality module showing placement of internal components and backplane connectors.

Each personality module 41, such as the one shown in FIG. 6, includes personality module-specific core components 49 unique to each type of personality module, providing functions such as user access, network access, computer processing, control capabilities or encryption support. The chassis can be used to hold those modules which are needed for a particular task. The user has the ability to use the chassis as a platform on which a custom system can be built by simply adding the needed modules. The filtered power supply 50 shown in FIG. 6 within each personality module allows each personality module to be individually powered on or off by switch 56 and hot-swapped without impact to other personality modules installed in the same multi-slot modular chassis. This functionality is subject to the master power on or off status of a multi-slot modular chassis in the case where a control personality module, capable of regulating power to individual personality module slots, is present in the chassis. The power supply 50 takes the raw DC power supplied across the chassis backplane and conditions it, including providing power adaptation, such as from 12 volts DC to 5 volts DC if required, as well as power filtering and cleaning up the power from any outside interference. Also, as mentioned previously, the module may have data input/output ports 47 or power ports 54 in addition to or in place of the power and IP backplanes.

Network access personality modules provide the ability to uplink a mobile, modular communications system with an external IP-based network. Core components may include a mix of different technologies, including custom-developed technologies and commercially available technologies integrated at the board or sub-component level. For example, in one embodiment of a network access personality module, a Mobile Access Router may be embedded to provide IP-based access to external networks, while in another embodiment, a router may be embedded into the network access personality module to provide IP over ISDN access to external ISDN networks. Different embodiments of network access personality modules may include network technologies such as IP LANs, Cellular Modems, Wireless LAN/WiFi systems or ISDN routers.

User access personality modules allow individual users to access the mobile, modular communications device, and remote networks, through a plurality of user interfaces supporting a plurality of user device technologies. For example, in one embodiment of a user access personality module, a commercially available LAN switch, providing 10/100/1000 Ethernet interfaces, with or without Power over Ethernet, may be utilized, while in another embodiment, a Voice over IP device may be embedded to support analog telephones, fax machines or secure call devices, such as the STU, STE or SCIP devices deployed by government or military organizations.

Computer processing personality modules allow a range of software applications to operate within the mobile, modular communications system for the purposes of either direct user access and benefit or for the purposes of storing, optimizing or otherwise processing voice, video, data or IP-based communications within the system. For example, in one embodiment of a computer processing personality module, a commercially available computer or data/file server may be utilized for the storage or manipulation of data, while in another embodiment, an integrated IP-based acceleration or optimization device may be embedded to improve the performance of communications traffic through both the mobile modular communications system as well as across external networks through one or more network access modules.

Encryption support personality modules allow for the integration and/or support of IP-based data encryption systems deployed with the mobile, modular communications system. For example, in one embodiment of an encryption support personality module, a commercially available Inline Network Encryptor (INE), such as the Harris EMOD, may be directly embedded into the encryption support module, while in another embodiment, an encryption support personality module may only provide filtered power to an external INE along with IP-based access to and from the INE.

Access to the functions available within a personality module may be available through either the IP-data communications backplanes of the multi-slot modular chassis or through interface ports 47 located on the top of the personality module, such as RJ-45, DB-9 or similar industry standard interface ports. Personality module core components may also be comprised of a mix of different technologies, including custom-developed technologies and commercially available technologies integrated at the board or sub-component level.

Noting the plurality of components and sub-components that can be embedded into a personality module, the significant feature and invention of the personality module is the ability to develop custom personality modules to adapt to changing user requirements without having to modify or alter the multi-slot modular chassis or other personality modules that may co-exist within the same multi-slot modular chassis. While modules have been described with reference to the functions that they enable, it is possible to have a single module perform different functions. For instance, a control module regulating data transfer from the system to another network may also have a mobile access router, giving the module the functions of a network access personality module.

Control personality modules accept and distribute power to the power backplane of a multi-slot modular chassis, via any combination of external AC, external DC/battery or internal battery sources. The control module also controls IP-based communications traffic either between individual base chassis module slots or between multi-slot modular chassis and other, external, devices or networks such as another auxiliary chassis. It is the ability to act as the gateway for all data transmission that is the hallmark of a control module. Individual personality modules may also support multiple functions, such as combinations of control and network access capabilities.

Figure 7:
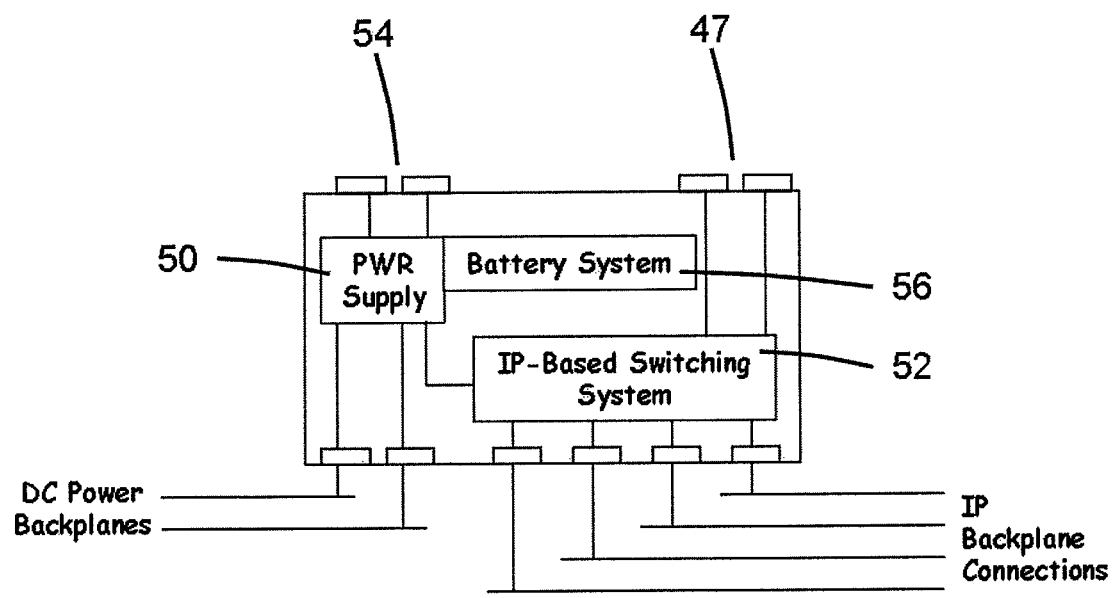
FIG. 7 is a schematic view of a control personality module showing placement of internal components and backplane connectors.
Figure 8:
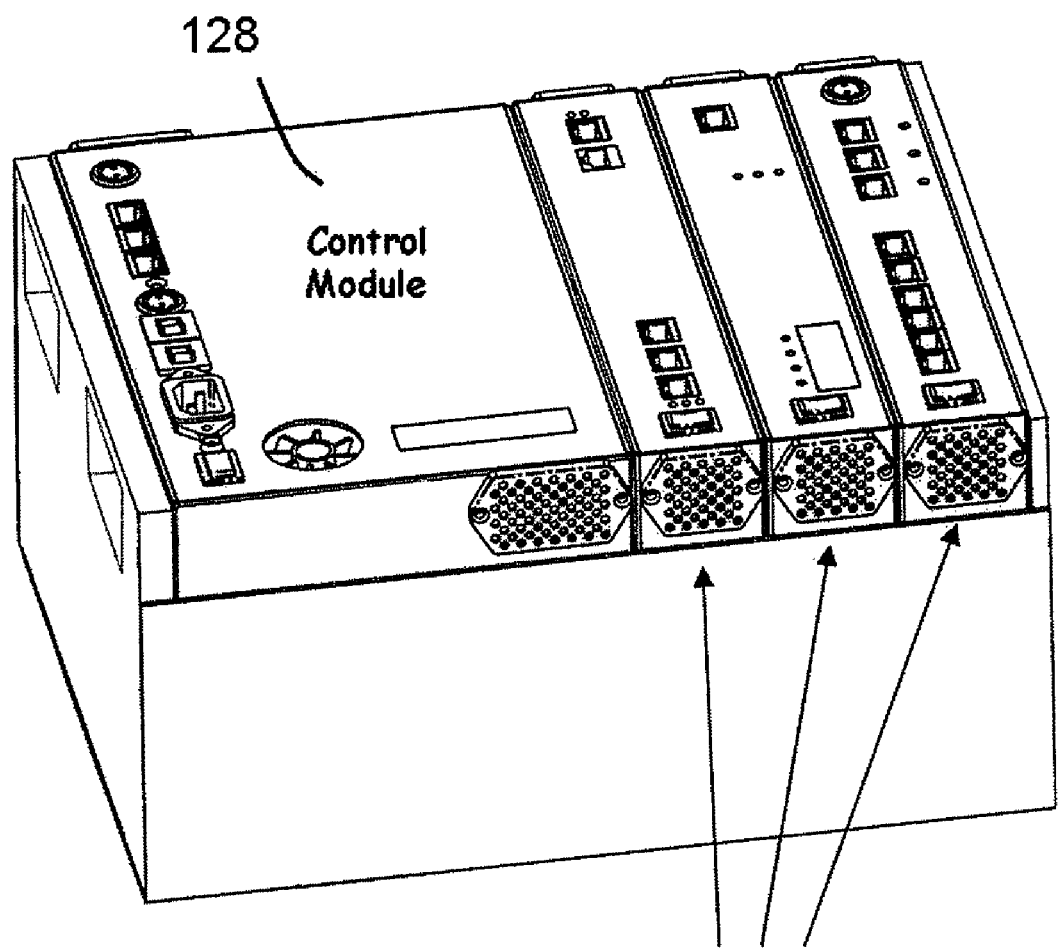
FIG. 8 is an example of a base chassis with a control personality module spanning four (4) individual slots.
Figure 9:
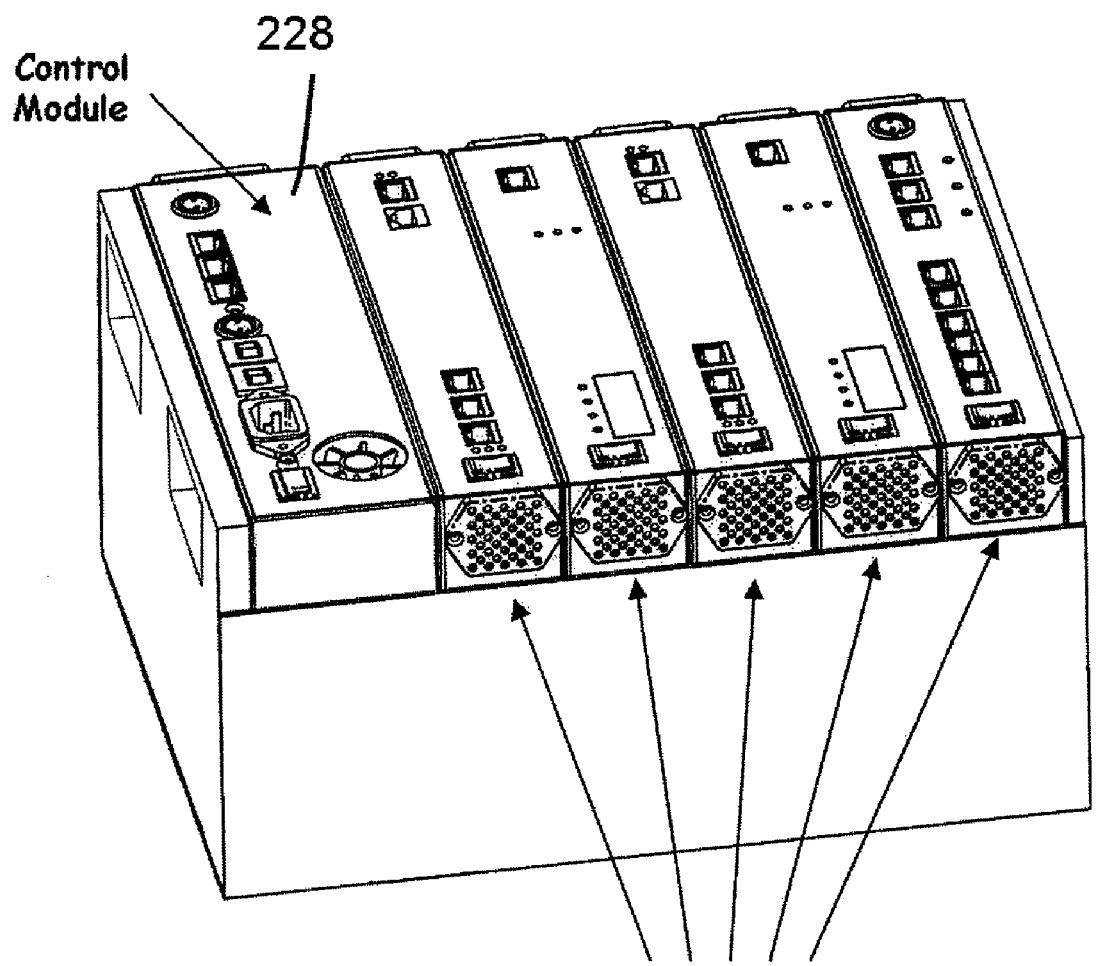
FIG. 9 is an example of a base chassis with a control personality module spanning two (2) individual slots.
Figure 10:
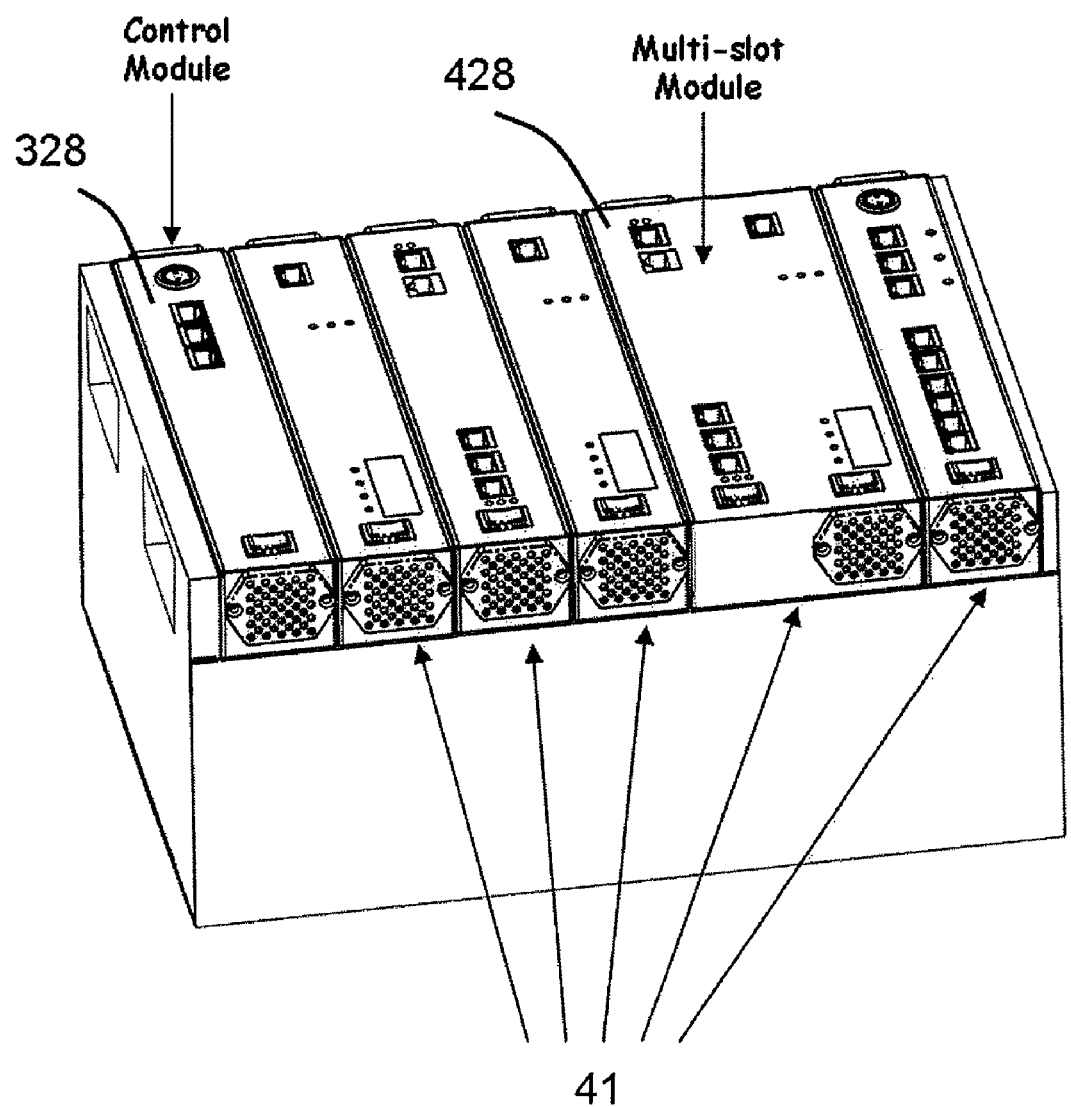
FIG. 10 is an example of a base chassis with a single slot control personality module and a multislot personality module.
Figure 11:
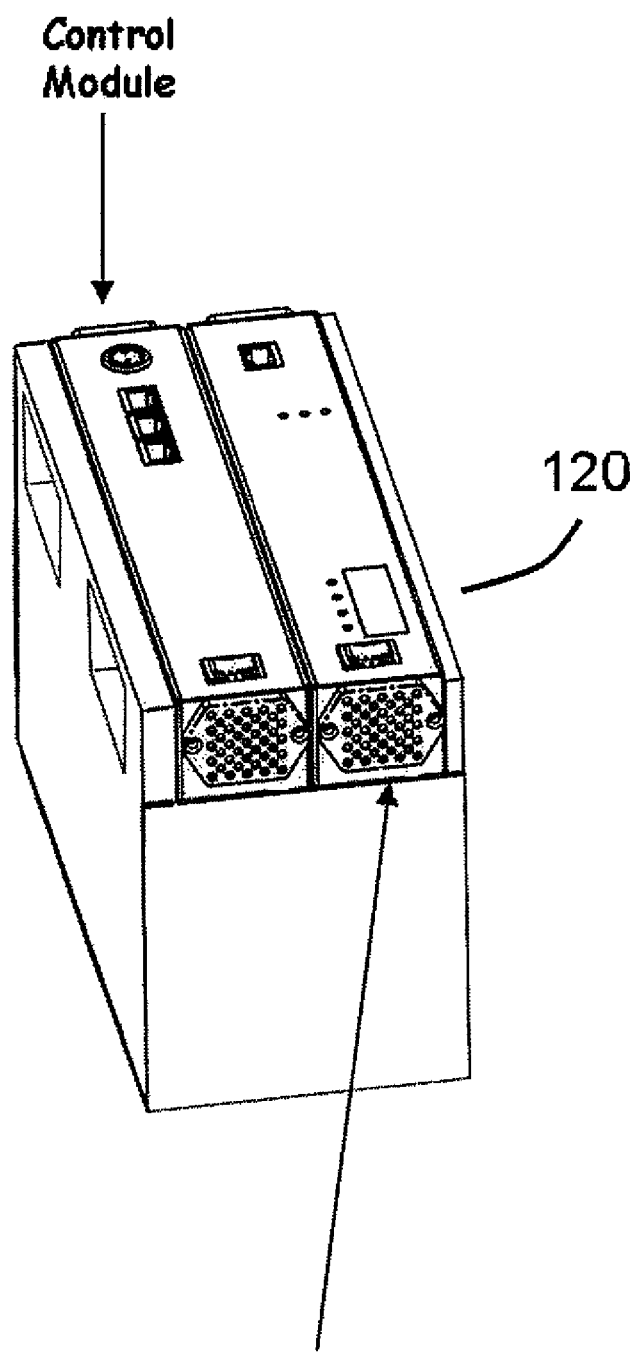
FIG. 11 is an example of a two (2) slot embodiment of the base chassis.

The flexibility of the IP-based communications backplanes shown in FIG. 4 are optionally enhanced by the optional addition of an IP-based switching function 52 in a control personality module as shown in FIG. 7. This function, designed for use with the first IP-based communications backplane 40, allows for communications between individual personality module slots to be either enabled or restricted based on the mission-specific communications requirements at the time of deployment. For example, certain individual personality modules may be permitted to communicate through the IP-based communications backplane but restricted from communicating directly to other individual personality modules. This is a useful feature in situations where different groups of independent users are utilizing the same mobile modular communications system at the time of deployment but do not have a requirement for, or have a security restriction on, communicating between user groups. This feature can also be used to restrict or isolate different types of IP-based communications, such as voice, data or video, for purposes of controlling or optimizing access to encryption support or computer processing modules. If power is not to be supplied by an external source, the control module includes a battery system 56 for supplying power to all modules through the power backplane or power ports 54. It is possible for each module to have its own battery power supply. This increases the weight of the system but adds more power capabilities to the system and allows the system to not have a power backplane It is possible to have a module, either control or general, that occupies more than one slot in the chassis. FIG. 8 shows an embodiment of a control personality module 128 that occupies four slots whereas FIG. 9 shows an embodiment of a control personality module 228 occupying two slots. FIG. 10 depicts an embodiment of a control personality module 338 that occupies one slot and a general personality module 428 that occupies two slots. FIG. 11 shows a two slot chassis 120 but the smallest possible multi-slot modular chassis unit is a single slot where the module is a control module also having general module capabilities such as network access, user access, computer processing and encryption. In FIG. 11, one slot contains a control module with the other having a general module. Such a chassis can be an auxiliary chassis. Auxiliary chassis are useful to segregate modules supporting devices having classified information from those that do not. The auxiliary chassis can be physically separated from the main chassis and connected thereto by tethers.

Figure 12:
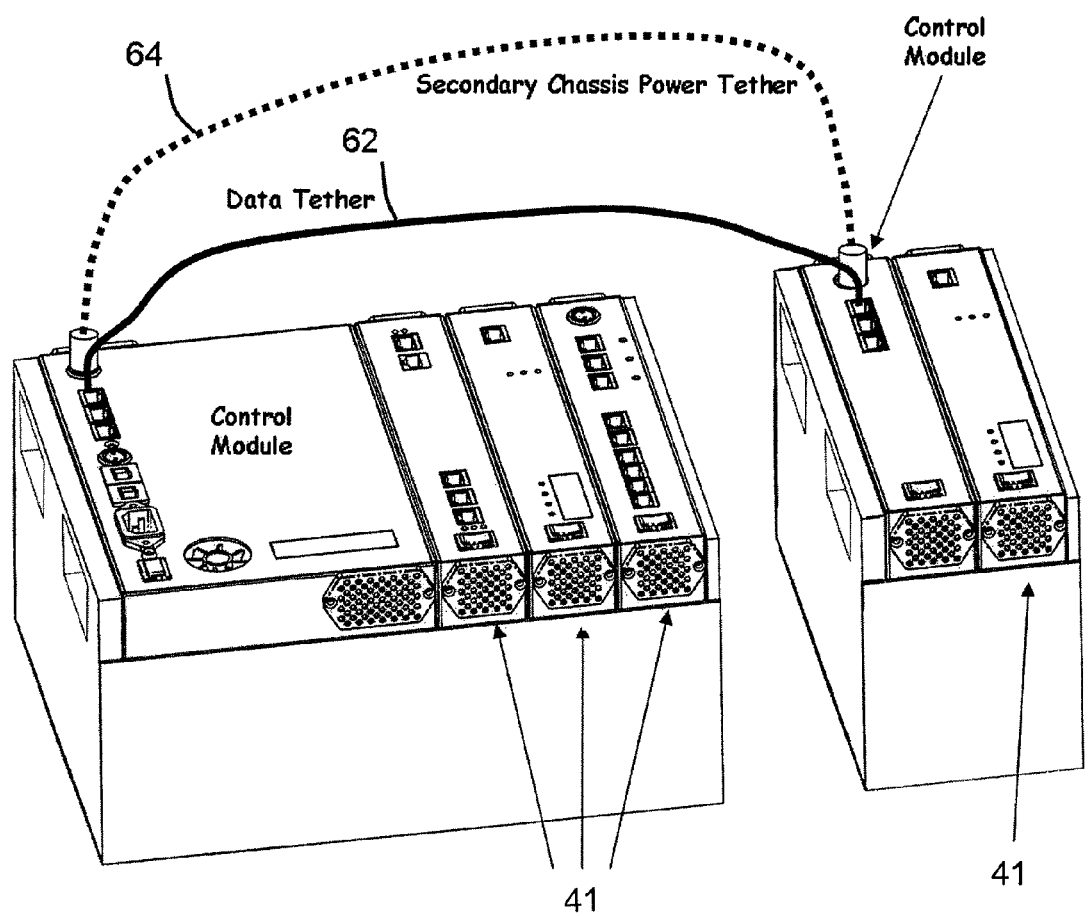
FIG. 12 is an example of multi-slot secondary chassis connected to a main chassis via data and power tethers.
Figure 13:
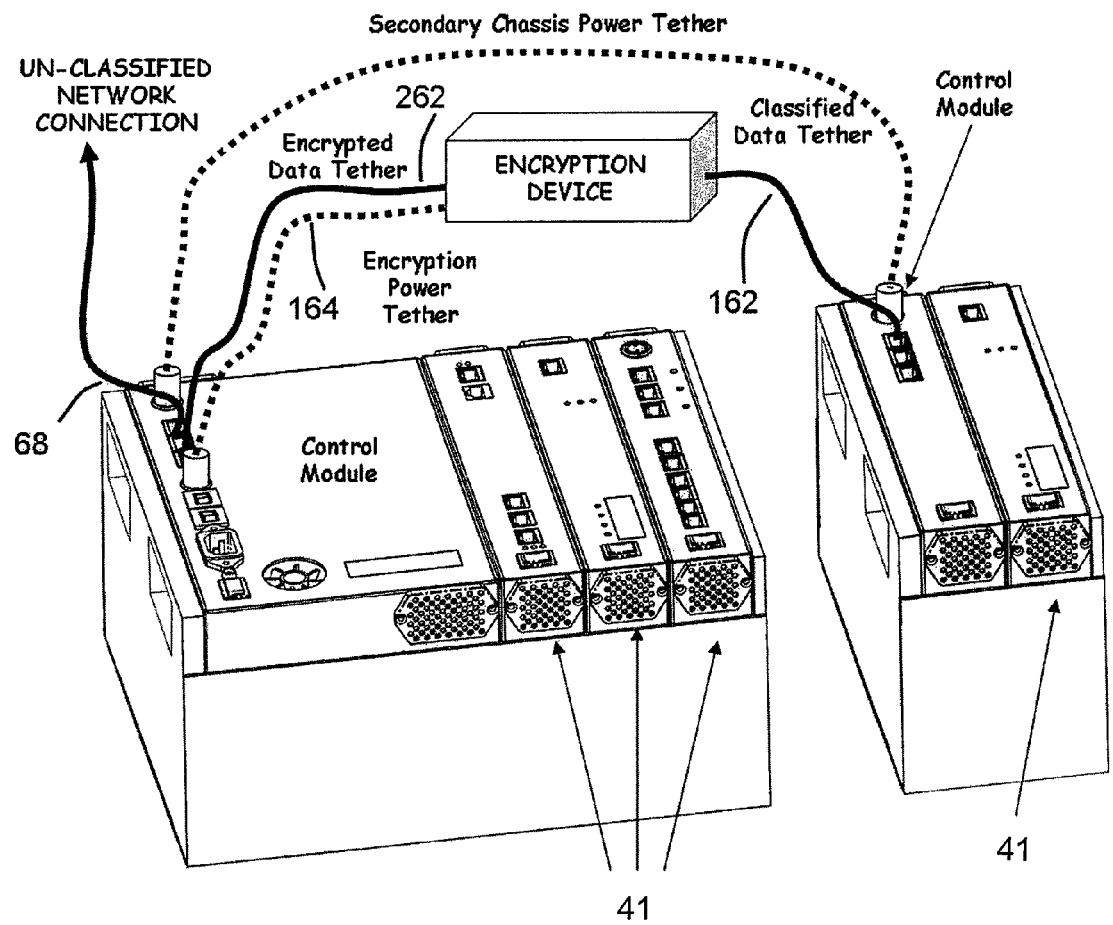
FIG. 13 is an example of multi-slot secondary chassis connected via data and power tethers with an Inline Network Encryptor (INE) inserted between the multi-slot secondary chassis to allow for secure data to be passed over an unsecure network.
Figure 14:
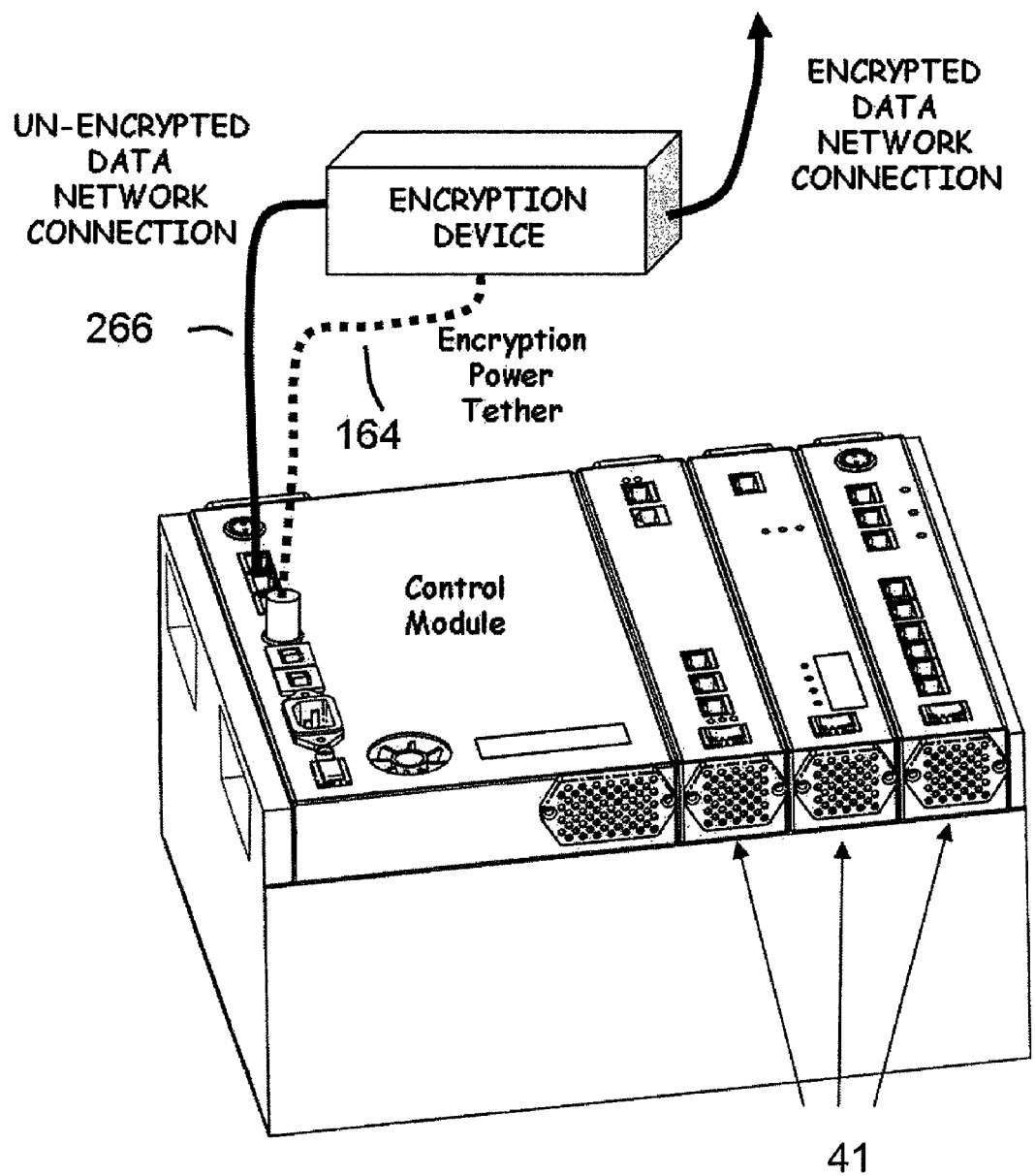
FIG. 14 is an example of a single multi-slot base chassis and an external Inline Network Encryptor (INE) passing traffic to a secure network.

FIGS. 12-14 show applications of the mobile modular communications device and its ability to support a plurality of network and user functions, particularly with regard to the deployment of both secure and non-secure communications in a single system, especially the communication between the main and auxiliary chassis. FIG. 12 depicts a primary system powering a secondary system and how a secondary system augments the capabilities and/or capacity of a primary system. The primary system in this embodiment is a multi-slot modular chassis housing a multi-slot control personality module and three general single-slot personality modules. The control personality module provides power to the general personality modules in the main chassis as well as to the auxiliary multi-slot modular chassis through a power tether 62. IP-based communications between the two units is accomplished through the use of a data tether 64, such as an IP-based 10/100/1000 Ethernet LAN data tether. The secondary system in this embodiment is a two (2) slot multi-slot modular chassis populated with a single-slot control personality module and a single-slot general personality module. Both control personality modules are supporting a plurality of functions, including power to the chassis power backplanes, and, in the case of the secondary control personality module, the functions of a network access personality module providing an IP-based uplink to the primary multi-slot modular chassis. It is possible for the data tether to connect to a general personality module in which case all data passes through the module in the main chassis to which the tether is attached and to the control module via the IP backplane.

FIG. 13 expands on the embodiment shown in FIG. 12 through the addition of an Inline Network Encryptor (INE) between the two multi-slot modular chassis allowing for the secondary multi-slot modular chassis to support secure communications, through a pre-encryption, or classified, data tether 162, which is encrypted by the INE for connection to the control personality module, through a post-encryption, or unclassified, data tether 262 in the primary multi-slot modular chassis. Power to the INE is provided through an encryption device power tether 164. In this example, the control personality module in the primary multi-slot modular chassis is not only providing power and IP-based connectivity to the encryption device, but is also providing the integrated function of a network access personality module through an IP-based RJ-45 10/100/1000 Ethernet LAN port 68, connected to an internal IP switch in the control personality module, for transport over the shown un-classified network.

FIG. 14 demonstrates a different application of the same embodiment of the primary base chassis shown in FIG. 13 with the exception that all communications traffic from the personality modules in the multi-slot modular chassis are encrypted through the IP-based 10/100/1000 Ethernet LAN connections 266 and DC Power Tether 164 supporting the external Inline Network Encryptor (INE) device. In this case, the general personality modules support classified devices, necessitating the need for an encryption device.

While the invention has been described with reference to preferred embodiments, variation and modification would be apparent to one of ordinary skill in the art without departing from the scope of the invention. The invention encompasses such variations and modifications.

The invention claimed is:

1. A mobile modular communication device comprising
a main chassis having a bottom and sides;
a plurality of slots formed in the main chassis for retaining modules;
at least one communication backplane on the bottom of the main chassis, the communication backplane having a connector in each slot;
an air plenum formed in the main chassis;
an outlet for the air plenum formed in each slot;
a module retained in one of the slots, the module having an air intake mating with the air plenum outlet; and
a fan in the module, the fan drawing air from the air plenum into the module and expelling air from the module through an exhaust port.

2. The device of claim 1, further comprising
an auxiliary chassis having a bottom and sides;
a plurality of slots formed in the main chassis for retaining modules;
at least one communication backplane on the bottom of the auxiliary chassis, the communication backplane having a connector in each slot;
a first control module in the main chassis;
a second control module in the auxiliary chassis; and
a communication tether between the first control module and the second control module.

3. The device of claim 2, further comprising
an encryptor with the communication tether.

4. The device of claim 2, further comprising
a control module in the main chassis,
a switch system in the control module to control all data transfer from other modules in the main chassis.

5. The device of claim 4, further comprising
at least one general module retained in the main chassis, the general module having at least one of a network access, user access, computer processing and encryption support function.

6. The device of claim 1, further comprising a power backplane on the bottom of the main chassis to supply power to the slots.

7. The device of claim 6, further comprising a control module in one of the slots, the control module receiving power from an external source and supplying power to the power backplane.

8. The device of claim 6, further comprising
a control module in one of the slots,
a battery in the control module, the battery supplying power to the power backplane.

9. A mobile modular communication device comprising
a housing;
a main chassis within the housing, the main chassis having a bottom and sides;
a plurality of slots formed in the main chassis for retaining modules;
at least one communication backplane on the bottom of the main chassis, the communication backplane having a connector in each slot;
a first control module in the main chassis;
an auxiliary chassis having a bottom and sides;
a plurality of slots formed in the main chassis for retaining modules;
at least one communication backplane on the bottom of the auxiliary chassis, the communication backplane having a connector in each slot; and
a second control module in the auxiliary chassis.

10. The device of claim 9, further comprising
an air plenum formed in the main chassis; and
an outlet for the air plenum formed in each slot.

11. The device of claim 9, further comprising
a communication tether between the first control module and the second control module.

12. The device of claim 11, further comprising
an encryptor in the communication tether.

13. The device of claim 11, further comprising a power tether between the first control module and the second control module.

14. The device of claim 9, wherein the first control module has an input to receive power from an external source.

15. The device of claim 9, further comprising a battery in the first control module.

16. The device of claim 9, further comprising a battery in the second control module.

17. The device of claim 9, wherein the housing is a case.

* * * * *